(12) United States Patent
Lee

(10) Patent No.: US 8,343,783 B2
(45) Date of Patent: Jan. 1, 2013

(54) LED MODULE AND PACKING METHOD OF THE SAME

(75) Inventor: Hao-An Lee, Yongkang (TW)

(73) Assignee: Long Jing International Technology Enterprise Co., Ltd., Yongkang, Tainan County (TW)

( * ) Notice: Subject to any disclaimer, the term of this patent is extended or adjusted under 35 U.S.C. 154(b) by 87 days.

(21) Appl. No.: 12/879,576

(22) Filed: Sep. 10, 2010

(65) Prior Publication Data

US 2012/0061690 A1 Mar. 15, 2012

(51) Int. Cl.
 *H01L 21/50* (2006.01)
(52) U.S. Cl. .................... 438/28; 257/E21.499
(58) Field of Classification Search .................. None
 See application file for complete search history.

(56) References Cited

U.S. PATENT DOCUMENTS 7,994,709 B2 * 8/2011 Verjans .......................... 313/504

* cited by examiner

*Primary Examiner* — Seahvosh Nikmanesh
(74) *Attorney, Agent, or Firm* — Muncy, Geissler, Olds & Lowe, PLLC

(57) ABSTRACT

A LED module and a packing method of the same include plural boards defined with a positive line and a negative line. The positive line connects to at least one positive joint, and the negative line connects to at least one negative joint. Some LEDs are respectively disposed on each board, and conducting ends of the LEDs are separately connected to the positive line and the negative line. A number of electronic elements are individually installed on each board, and conducting ends of the electronic elements are separately connected to the positive line and the negative line disposed on the board. A positive guiding line connects to the positive joint of each board, and a negative guiding line connects to the negative joint of each board. The LED module achieved in accordance with above-mentioned construction contributes to the flexibility.

4 Claims, 17 Drawing Sheets

LED MODULE AND PACKING METHOD OF THE SAME

BACKGROUND OF THE INVENTION

1. Field of the Invention

The present invention relates to a LED module and a packing method of the same, particular to a flexible LED module and the packing method of the LED module.

2. Description of the Related Art

A conventional LED module is shown in FIG. 17 substantially comprising a frame B, a circuit board C, and a plurality of lighting units D. The lighting units D electrically connect to the circuit board C. The circuit board C and the lighting units D are disposed in the frame B. The LED module could be installed on a car and provide lightness to enhance the driving safety. However, some problems still exist in such LED module when in use. The conventional LED module is inflexible and unfoldable. Nonetheless, a car body or a lamp of the car is usually designed into a curved surface. Thus, it is difficult to concentrate the light of each lighting unit of the inflexible LED module to increase the lightness. Moreover, fabricating the LED module involves certain difficulty. Therefore, it is necessary to solve the aforesaid problems.

SUMMARY OF THE INVENTION

In order to solve the problem that the conventional inflexible LED module is difficult to be installed on the curved car body or the car lamp, a LED module and a packing method of the same are provided. The provided LED module is flexible that each LED is able to be installed in accordance with the curved surface of the car body or the car lamp. Moreover, the function of the lamp set is not affected, and the manufacturing cost with respect to the assembling means is reduced.

A method for packing a LED module comprises steps of: A. classifying a printed circuit board into a plurality of boards in accordance with a matrix permutation; either part of the boards or each board defines a positive line and a negative line; at least one positive joint of the positive line and at least one negative joint of the negative line are defined on a longitudinal end or a lateral end of the board; B. connecting conducting ends of at least one electronic element and at least one LED to the positive line and the negative line, respectively; C. connecting a positive guiding line to each positive joint, and connecting a negative guiding line to each negative joint; D. fixing the conducting ends of the electronic element and the LED, the positive guiding line, and the negative guiding line to the printed circuit board, concurrently; and E. separating each board to form a LED module.

The concurrent fixing is achieved by processing the printed circuit board via a tin stove, thereby allowing the conducting ends of the electronic element and the LED, the positive guiding line, and the negative guiding line to be fixed to the printed circuit board.

A LED module made via the packing method comprises: a plurality of boards, each of which defines a positive line and a negative line; the positive line connects to at least one positive joint, and the negative line connects to at least one negative joint; the positive joint and the negative joint are situated to an end of the board; a plurality of LEDs are disposed on each board, respectively; conducting ends of the LEDs are connected to the positive line and the negative line, respectively; a plurality of electronic elements are disposed on each board, respectively; conducting ends of the electronic elements are connected to the positive line and the negative line of the board, respectively; a positive guiding line is connected to the positive joint of each board; and a negative guiding line is connected to the negative joint of each board.

Another method for packing a LED module comprises steps of: A. classifying a printed circuit board into a plurality of boards via a matrix permutation; each board defines a positive line and a negative line; a positive joint of the positive line and a negative joint of the negative line are respectively disposed near a longitudinal end or a lateral end of the board; B. connecting conducting ends of at least one electronic element and at least one LED to the positive line and the negative line, respectively; C. fixing the conducting ends of the electronic element and the LED to the printed circuit board, concurrently; D. separating each board to form a LED module unit; and E. connecting a plurality of positive guiding lines to the positive joints of the adjacent boards, and connecting a plurality of negative guiding lines to the negative joints of the adjacent boards, thereby forming a LED module.

The concurrent fixing is achieved by processing the printed circuit board via a tin stove, thereby fixing the conducting ends of the electronic element and the LED to the printed circuit board.

A LED module made via the packing method comprises: a plurality of boards, each of which defines a positive line and a negative line; the positive line connects to two positive joints, and the negative line connects to two negative joints; the two positive joints and the two negative joints are situated near two ends of the board, respectively; a plurality of LEDs are disposed on each board, respectively; conducting ends of the LEDs are connected to the positive line and the negative line, respectively; a plurality of electronic elements are disposed on each board, respectively; conducting ends of the electronic elements are connected to the positive line and the negative line of the board, respectively; a plurality of positive guiding lines, each of which is connected to the positive joint, adjacent to the board; and a plurality of negative guiding lines, each of which is connected to the negative joint, adjacent to the board.

A fixing portion is disposed on the ends of the board with respect to the positive joint and the negative joint. The fixing portion adopts a buckle, a breach, or a screw hole that fixes each board to the frame or the plaque of the car.

The electronic element adopts an SMD electric resistance and a rectify diode.

A flexible lamp string formed by the LED module via aforesaid methods is obtainable so as to be installed on the car. The LED module could be installed in accordance with the curved surface of the car body or of the car lamp, thereby serving as a daytime running light or a taillight. No viscose is needed since the present invention utilizes the buckle or the screw to fix the board to the frame or the plaque. Therefore, the original idea and function of the car lamp are not affected.

DETAILED DESCRIPTION OF THE PREFERRED EMBODIMENTS

Figure 1:
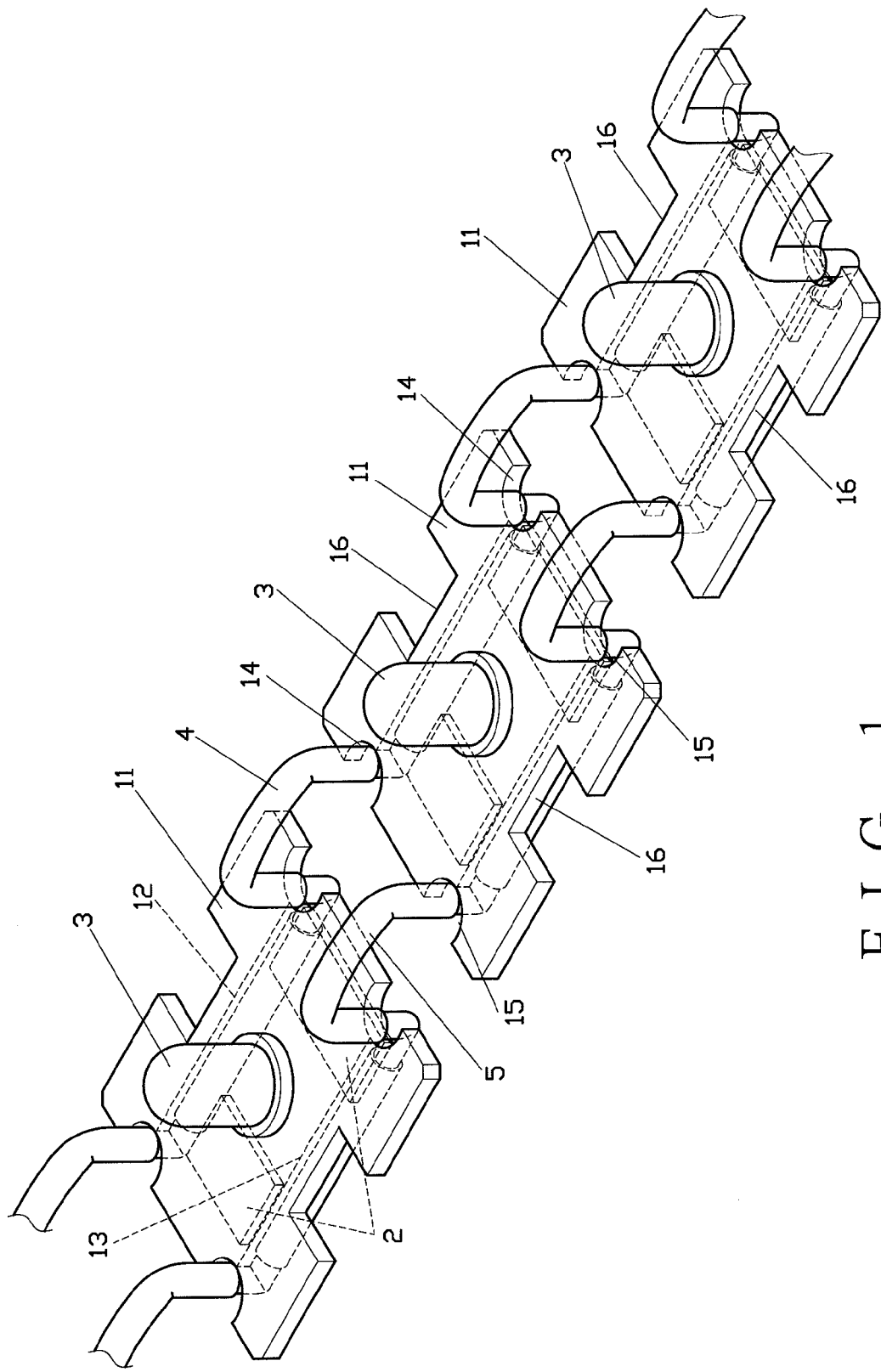
FIG. 1 is a schematic view showing a LED module of the present invention.
Figure 2:
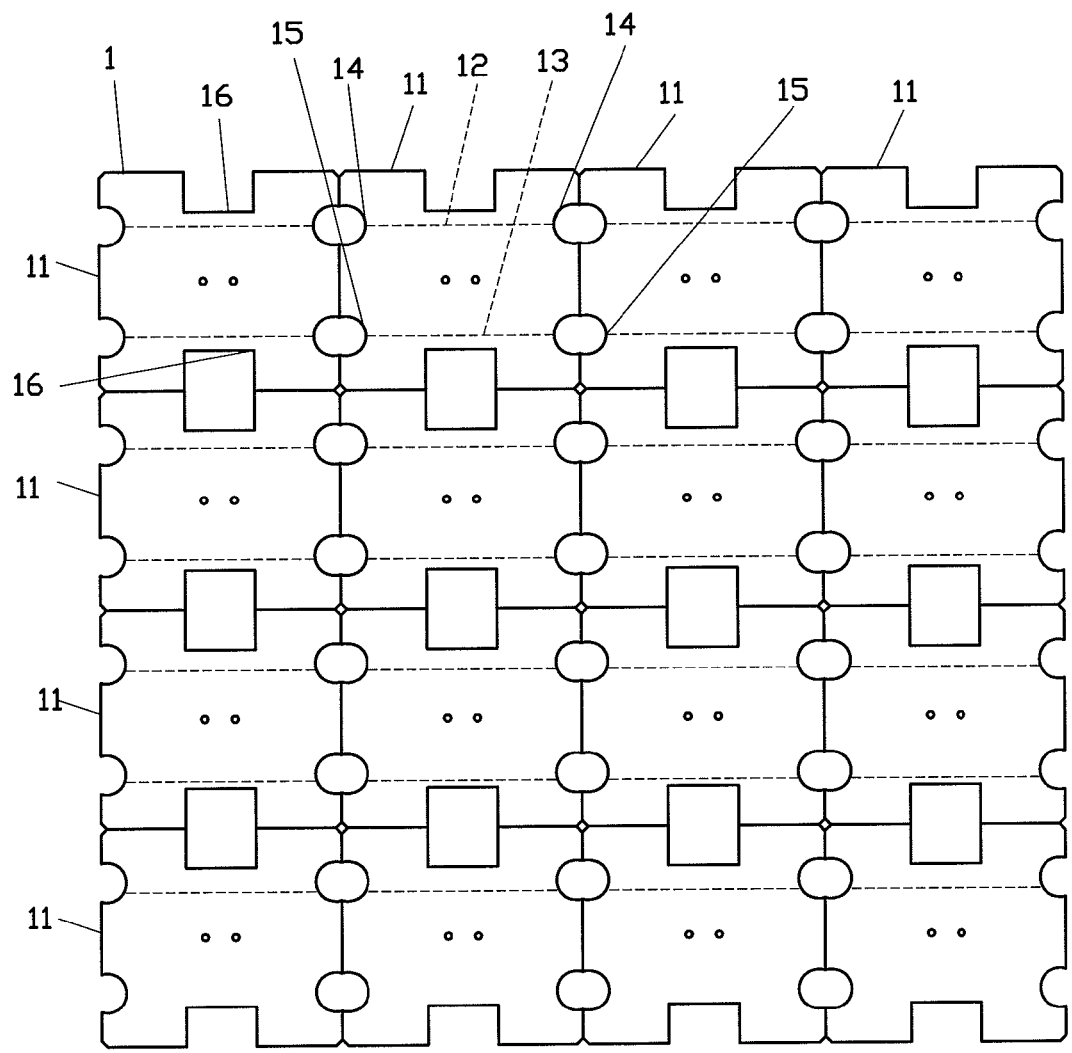
FIG. 2 is a schematic view showing a printed circuit board of the present invention.
Figure 3:
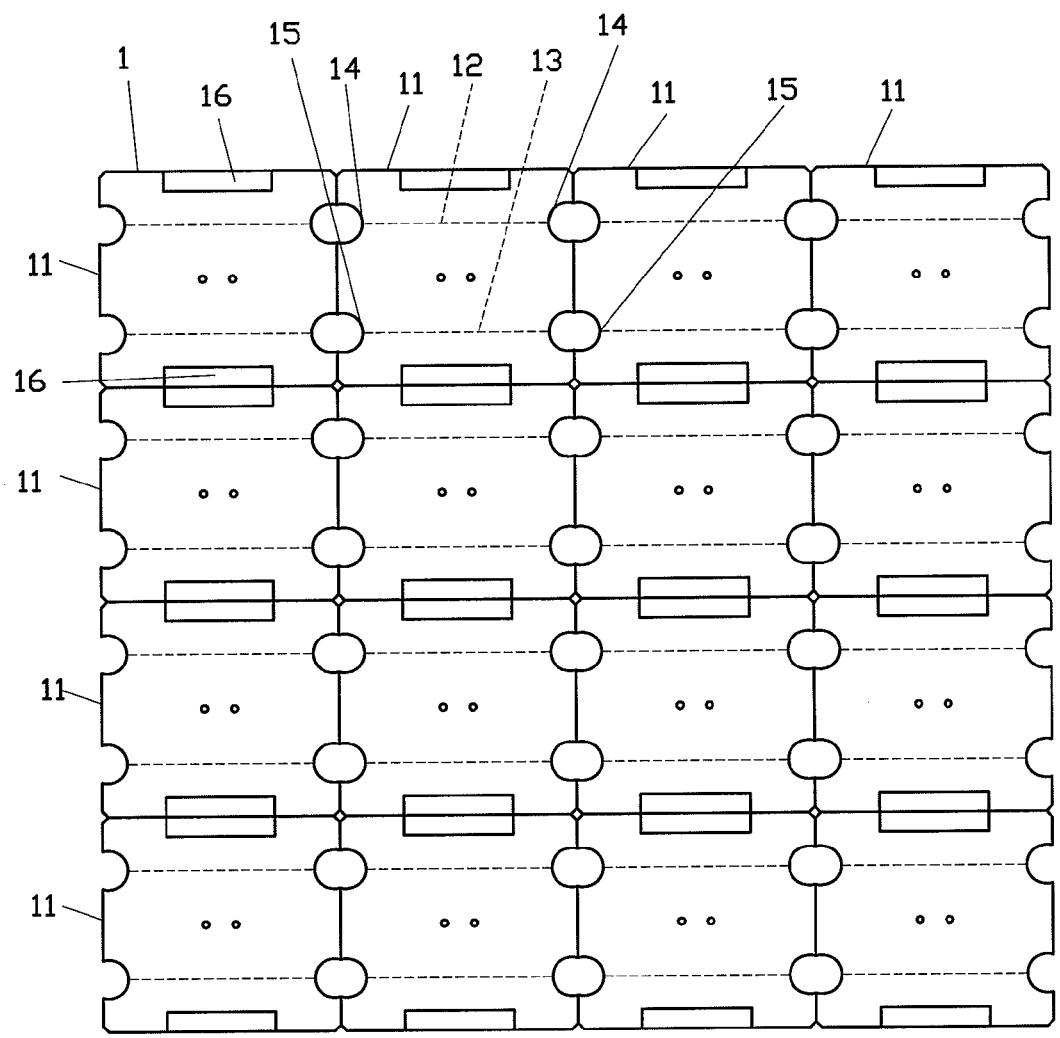
FIG. 3 is a schematic view showing another printed circuit board of the present invention.
Figure 16:
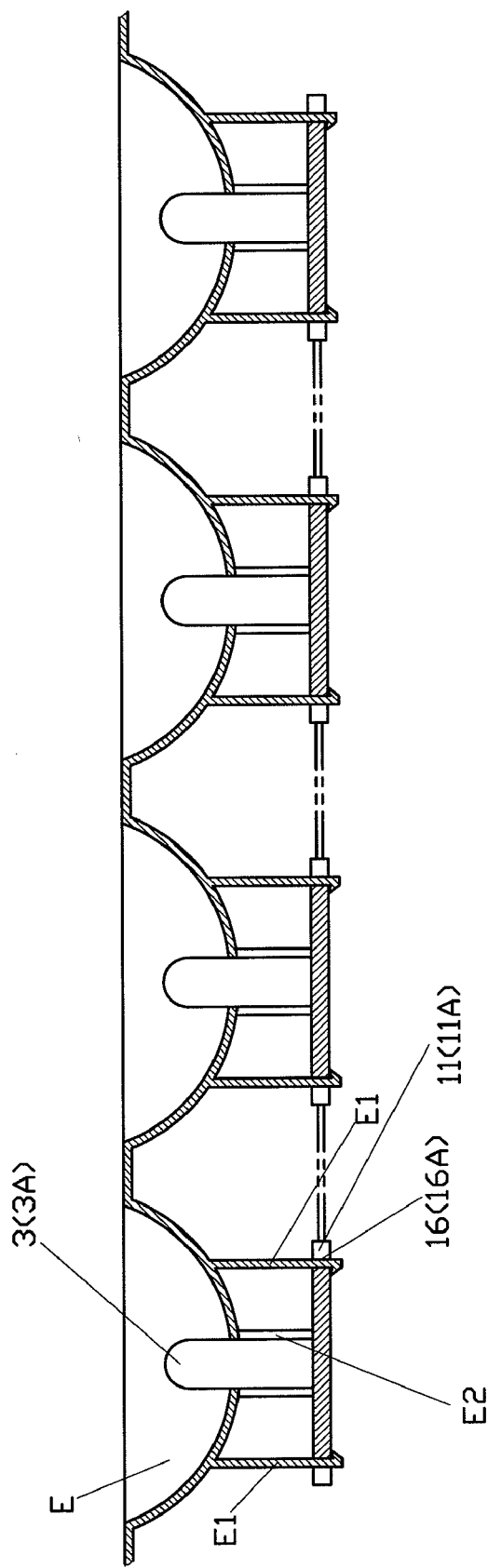
FIG. 16 is a schematic view showing another LED module being installed on a frame or a plaque of a car.
Figure 17:
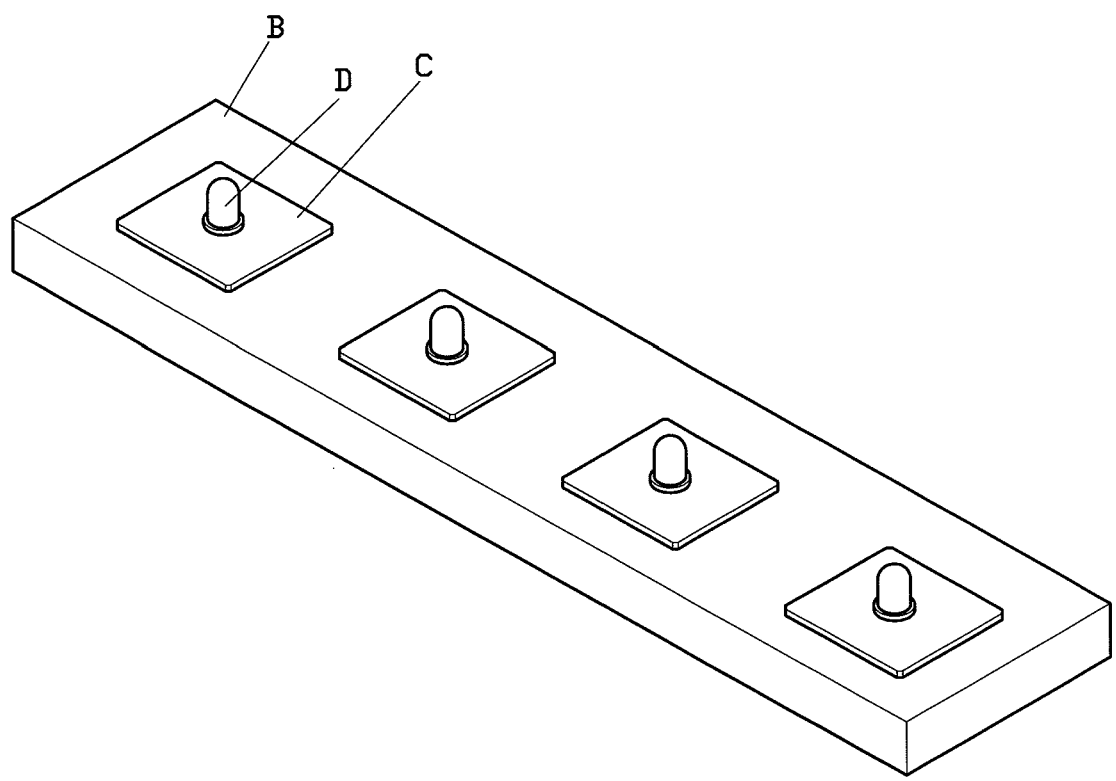
FIG. 17 is a schematic view showing a conventional LED lamp.

The novel features and inventive steps of the present invention could be clearly performed by referring the following preferred embodiments and the correlated figures. Referring to FIG. 1, a LED module is applied to a car and is made in accordance with a packing method for the LED module. The method comprises steps of classifying a printed circuit board 1 into a plurality of boards 11 in accordance with a matrix permutation. Either a part of the boards 11 or each board 11 defines a positive line 12 and a negative line 13. At least one positive joint 14 of the positive line 12 and at least one negative joint 15 of the negative line 13 are defined on a longitudinal end or a lateral end of the board 11. FIG. 2 shows the preferred embodiment of the present invention that the printed circuit board 1 defines the positive line 12 and the negative line 13 on each board 11, and the positive joint 14 and the negative joint 15 are respectively disposed on two lateral ends of the board 11. A fixing portion 16 is disposed on two ends of the board 11 with respect to the positive joint 14 and the negative joint 15. The fixing portion 16 adopts either a breach, a buckle (as shown in FIG. 3), or a screw hole. The fixing portion 16 fixes each board 11 to the frame or the plaque E of the car. As shown in FIGS. 16 and 17, the fixing portion 16 of the preferred embodiment of the present invention adopts the breach. Thereby, hooks E1 of the plaque E buckle with the fixing portion 16, and blocking posts E2 of the plaque E further limit the board 11 so as to prevent the board 11 from displacing.

Figure 4:
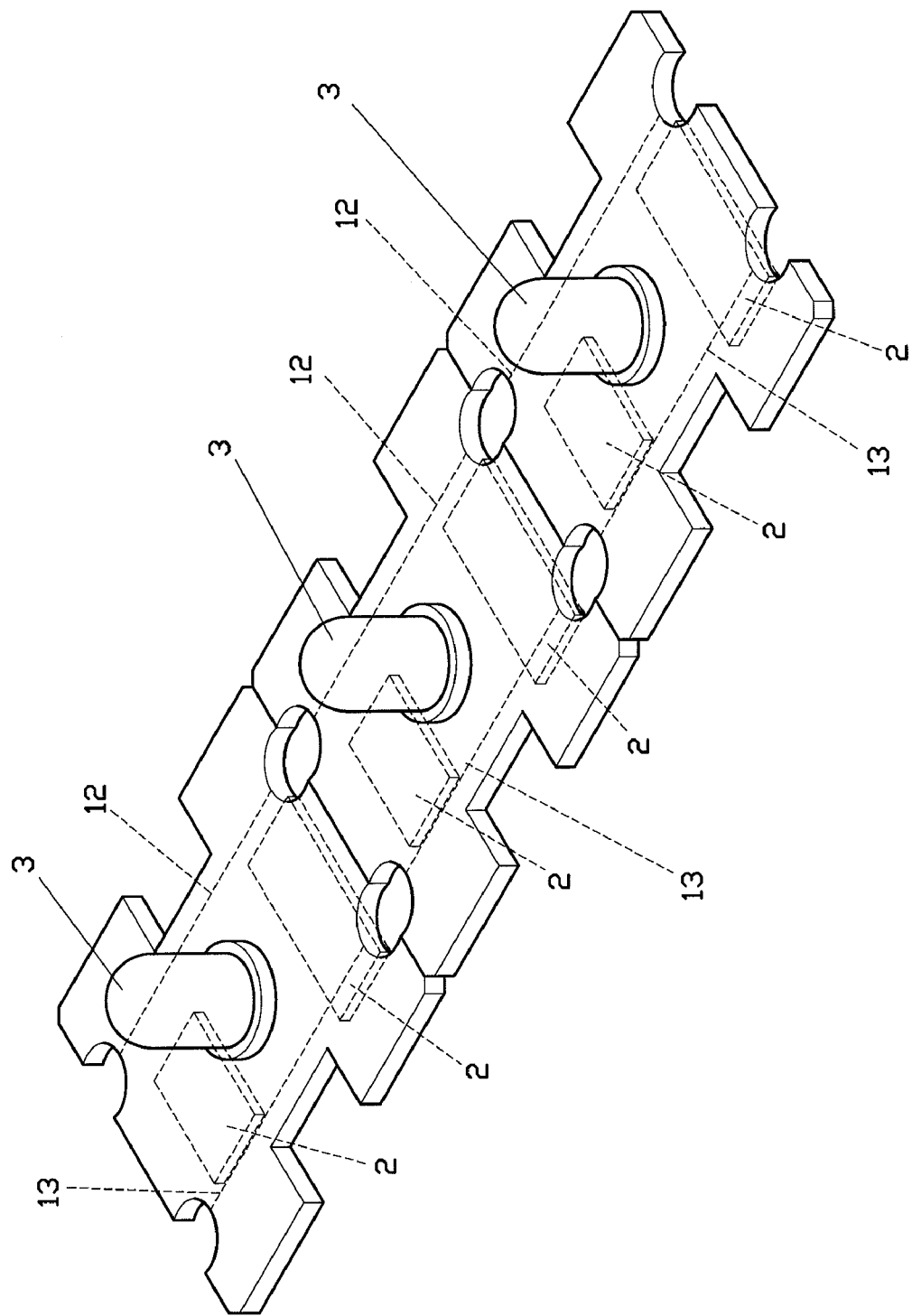
FIG. 4 is a schematic view showing an electronic element and a LED being connected to a board.

Referring to FIG. 4, conducting ends of at least one electronic element 2 and at least one LED 3 are connected to the positive line 12 and the negative line 13, respectively. Wherein, the electronic element 2 adopts an SMD electric resistance and a rectify diode. The electronic element 2 adopts a standard structure in the market, and herein the common function thereof is omitted.

Figure 5:
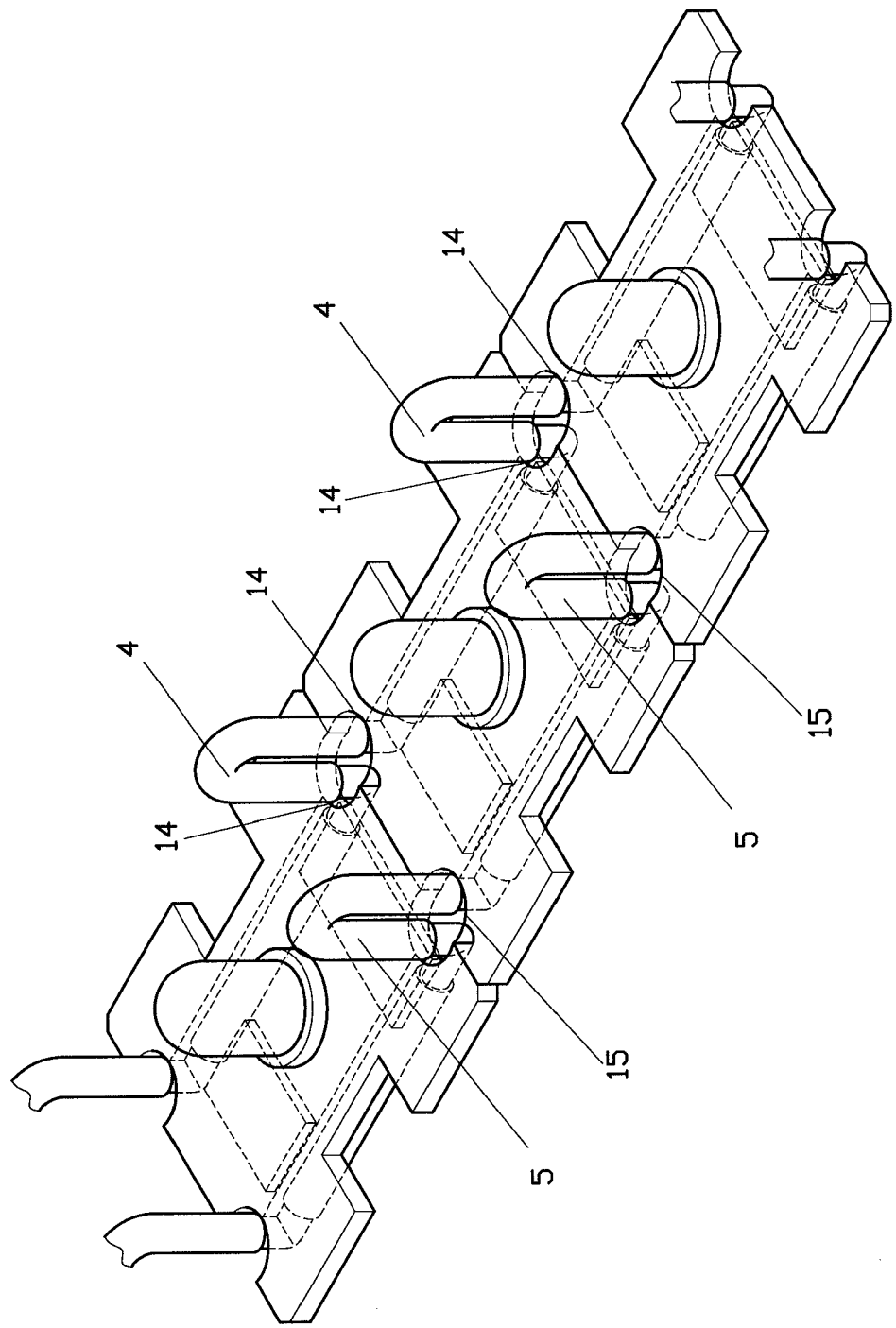
FIG. 5 is a schematic view showing a positive guiding line and a negative guiding line being connected to the board.

Referring to FIG. 5, a positive guiding line 4 is connected to each positive joint 14, and a negative guiding line 5 is connected to each negative joint 15.

Figure 6:
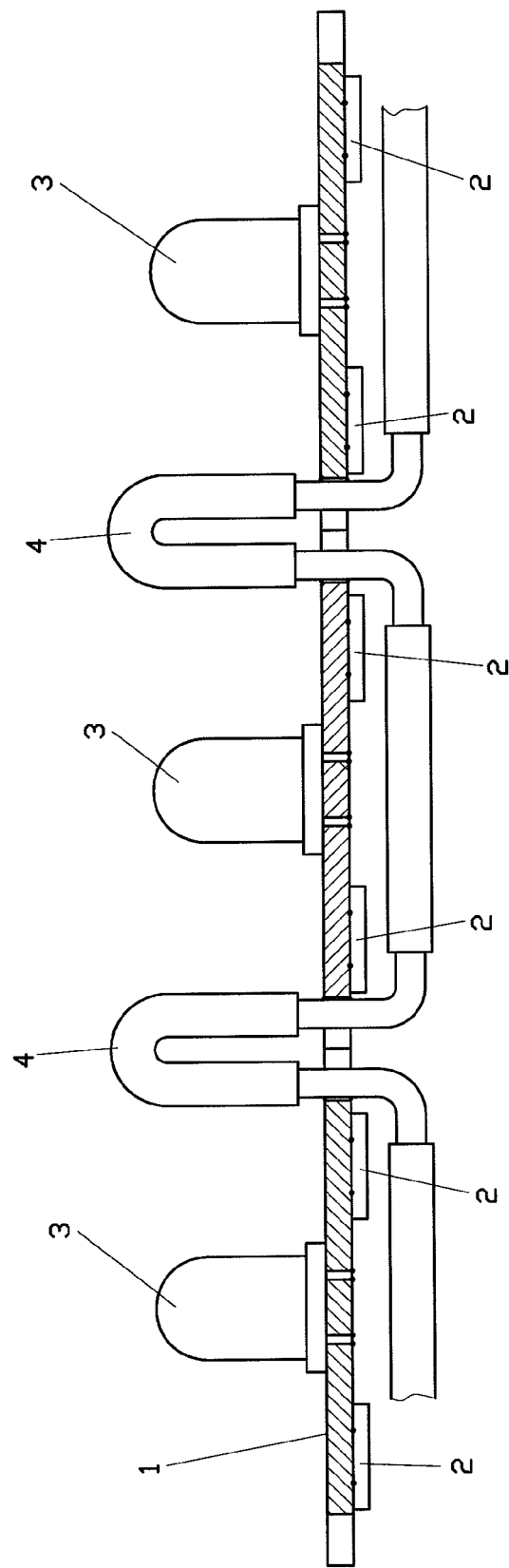
FIG. 6 is a schematic view showing the electronic element, the LED, a positive guiding line, a negative guiding line being soldered to the printed circuit board, concurrently.

Referring to FIG. 6, the conducting ends of the electronic element 2 and the LED 3, the positive guiding line 4, and the negative guiding line 5 are fixed to the printed circuit board 1, concurrently. Herein, the concurrent fixing adopts means that the printed circuit board 1 is processed via a tin stove, so that the conducting ends of the electronic element 2 and the LED 3, the positive guiding line 4, and the negative guiding line 5 are able to be soldered to the printed circuit board 1.

Figure 7:
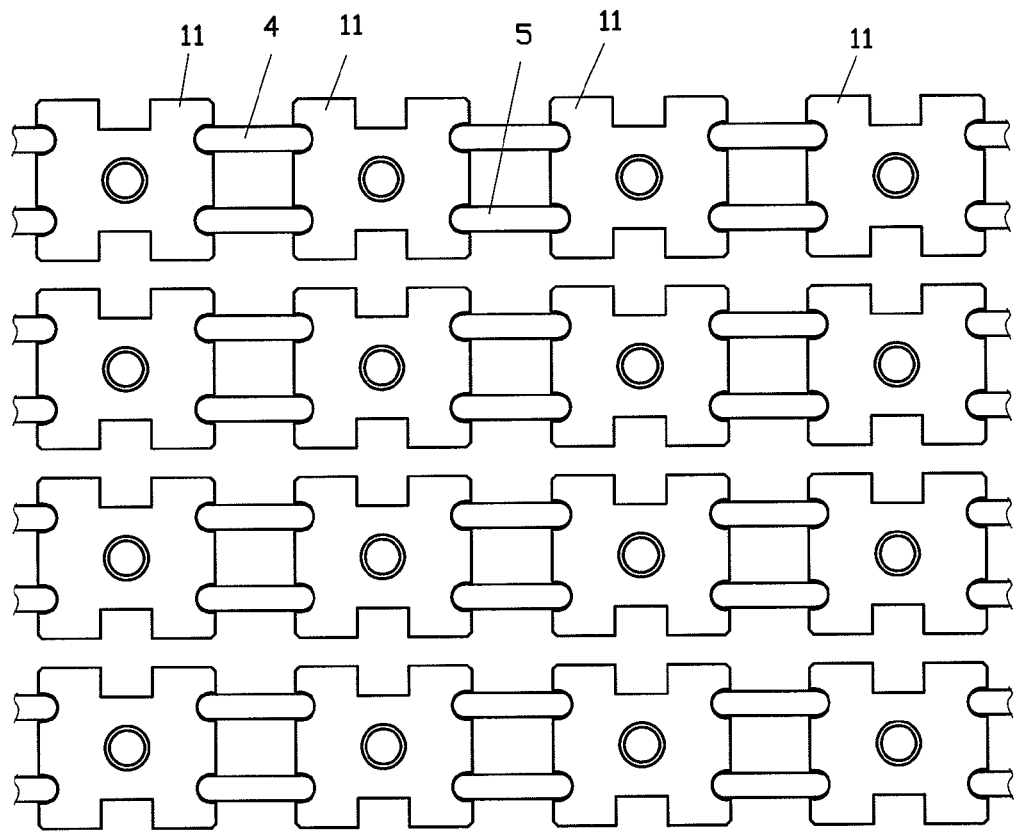
FIG. 7 is a schematic view showing the correlated relationship among each component after each board being separated.

Referring to FIG. 7, separating each board 11 to form the LED module allows each board 11 to construct a flexible lamp string as shown in FIG. 1.

Figure 8:
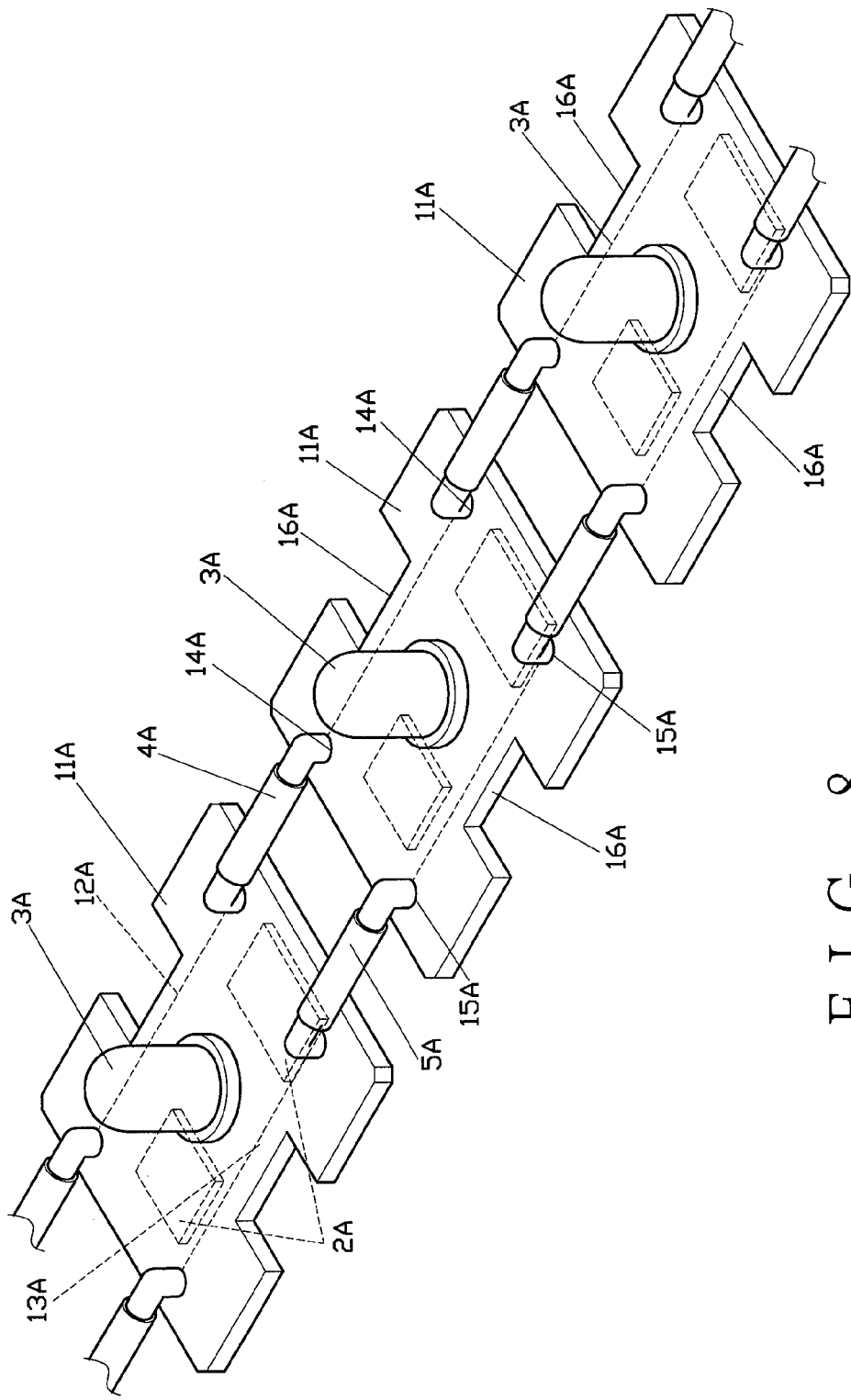
FIG. 8 is a schematic view showing another LED module of the present invention.
Figure 9:
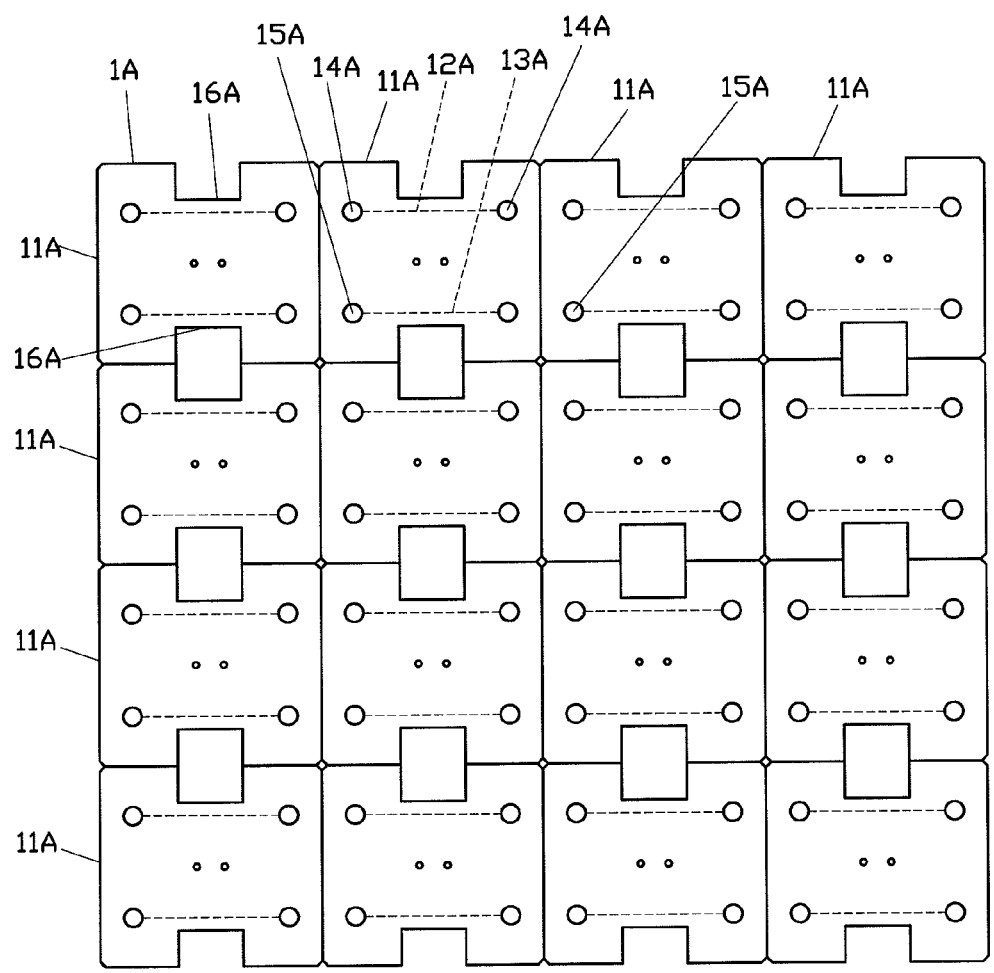
FIG. 9 is a schematic view showing another printed circuit board of the present invention.
Figure 10:
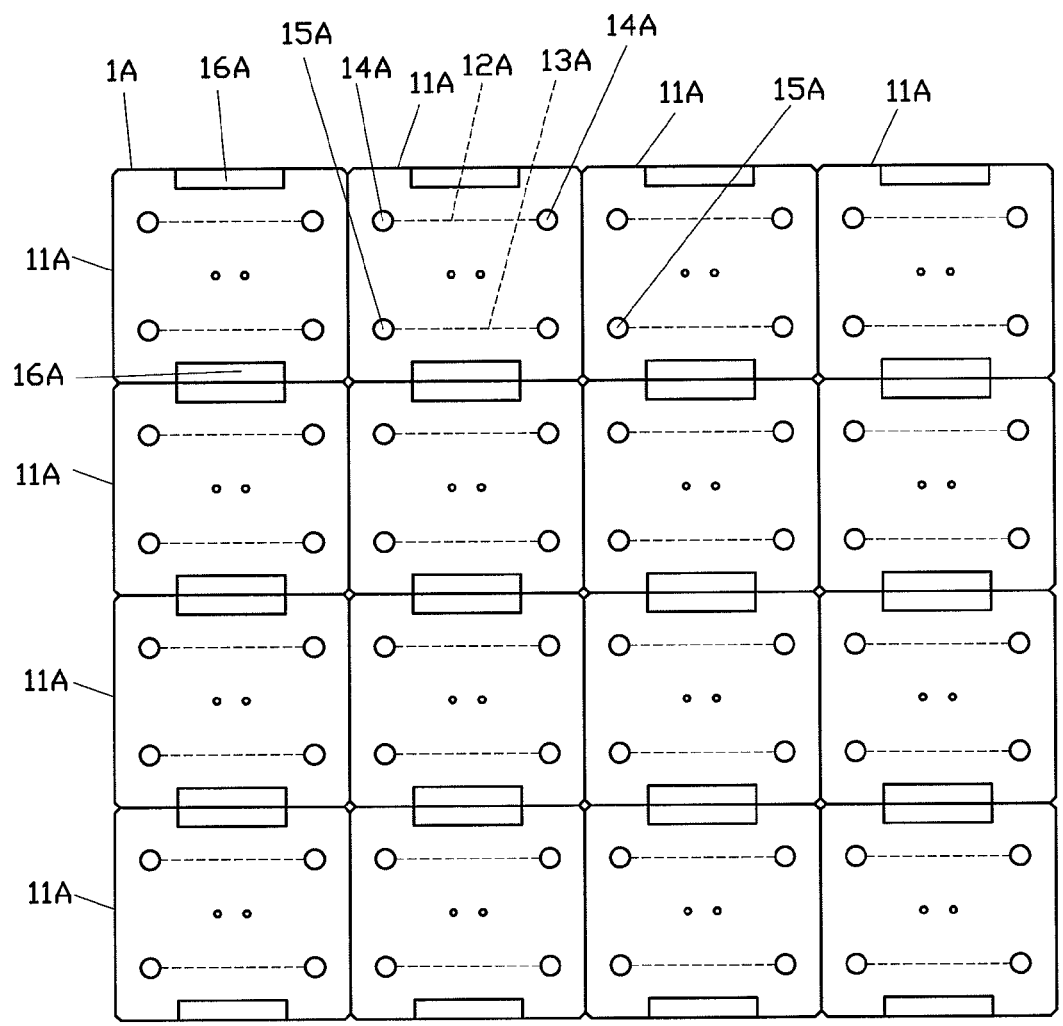
FIG. 10 is a schematic view showing another printed circuit board of the present invention.
Figure 15:
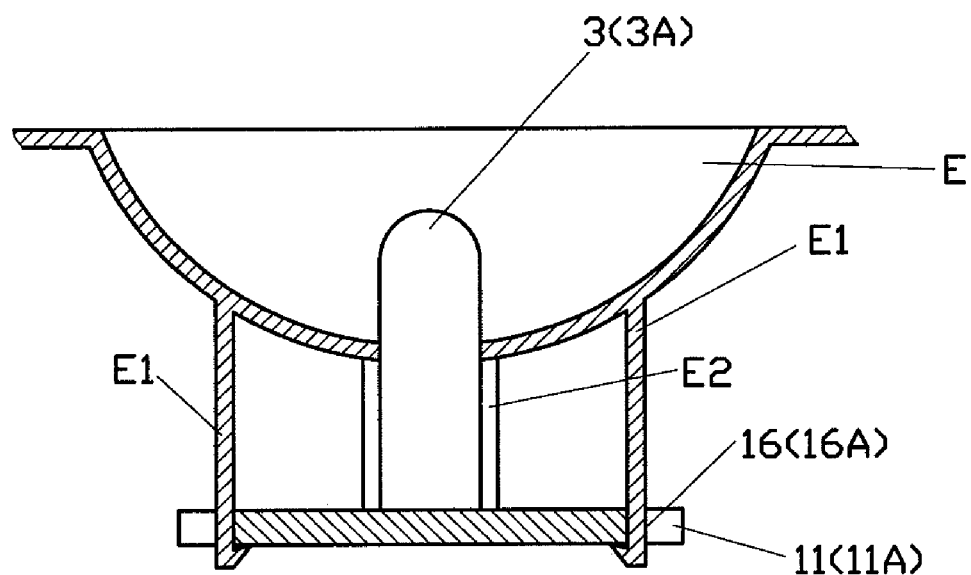
FIG. 15 is a schematic view showing the LED module being installed on a frame or a plaque of a car.

Another preferred embodiment of the present invention is shown in FIG. 8. A LED module is applied to a car and is made in accordance with a packing method for the LED module. The method comprises steps of classifying a printed circuit board 1A into a plurality of boards 11A via a matrix permutation. Each board 11A defines a positive line 12A and a negative line 13A. A positive joint 14A of the positive line 12A and a negative joint 15A of the negative line 13A are respectively disposed near a longitudinal end or a lateral end of the board 11A. Referring to FIG. 9, the printed circuit board 1A defines the positive line 12A and the negative line 13A on each board 11A, and one positive joint 14A and one negative joint 15A are respectively disposed near two lateral ends of the board 11A. A fixing portion 16A is disposed on two ends of the board 11A with respect to the positive joint 14A and the negative joint 15A. The fixing portion 16A adopts a breach, a buckle (as shown in FIG. 10) or a screw hole. The fixing portion 16A fixes each board 11A to the frame or the plaque E of the car. As shown in FIGS. 15 and 16, the fixing portion 16A of the preferred embodiment of the present invention adopts the breach. Thereby, hooks E1 of the plaque E buckle with the fixing portion 16A, and blocking posts E2 of the plaque E further limit the board 11A so as to prevent the board 11A from displacing.

Figure 11:
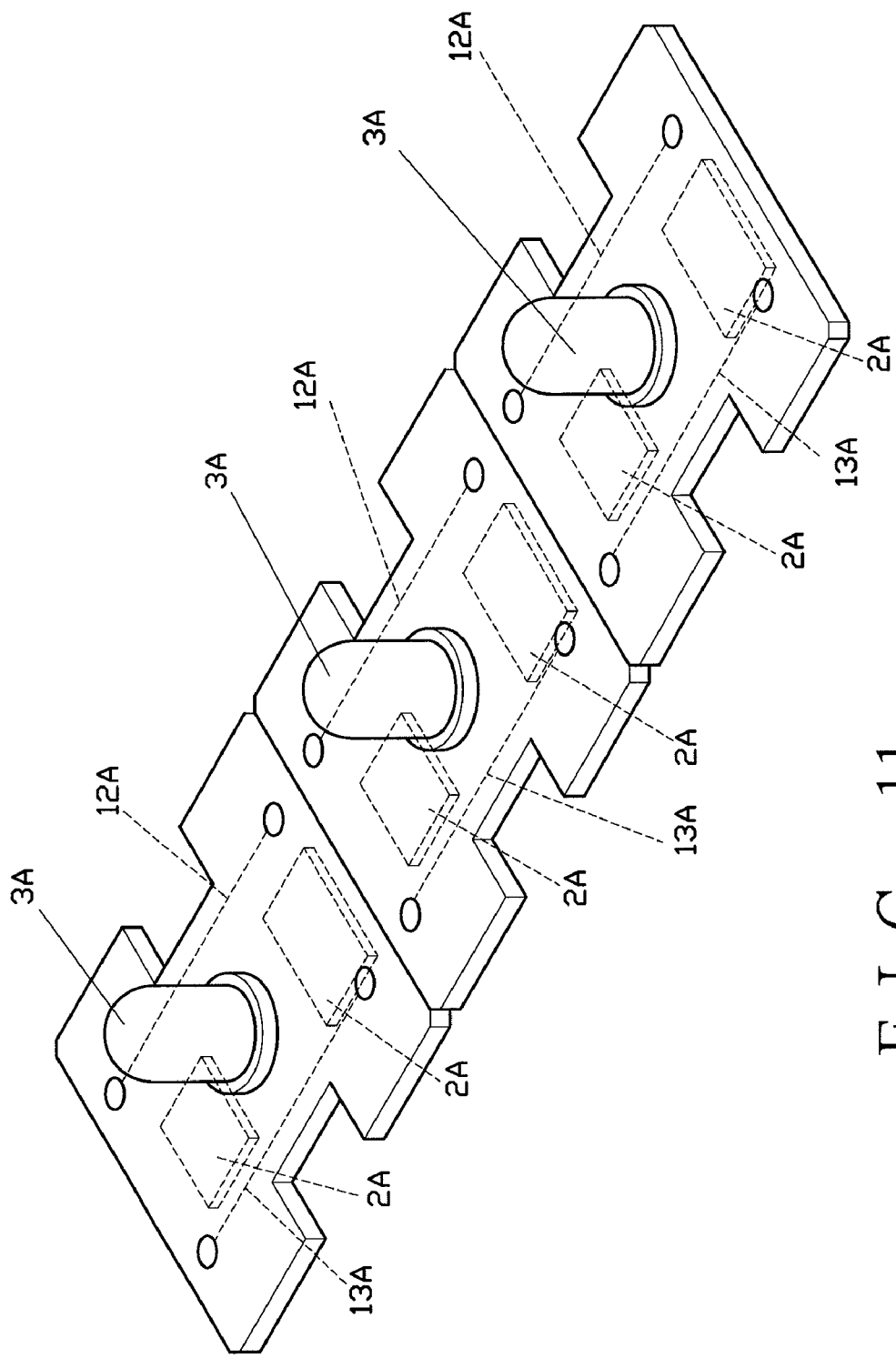
FIG. 11 is a schematic view showing an electronic element and a LED being connected to a board.

Referring to FIG. 11, conducting ends of at least one electronic element 2A and at least one LED 3A are connected to the positive line 12A and the negative line 13A, respectively. Wherein, the electronic element 2A adopts an SMD electric resistance and a rectify diode. The electronic element 2A adopts a standard structure in the market, and the conventional function is herein omitted.

Figure 12:
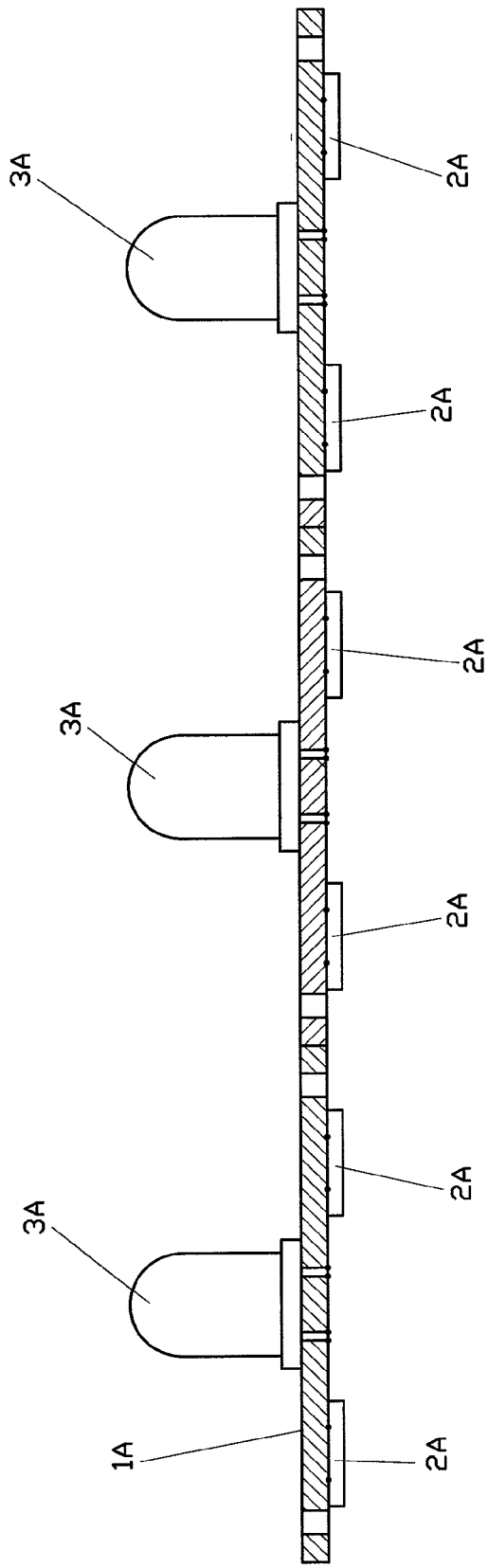
FIG. 12 is a schematic view showing another electronic element and another LED being soldered to the printed circuit board, concurrently.

Referring to FIG. 12, the conducting ends of the electronic element 2A and the LED 3A are fixed to the printed circuit board 1A, concurrently. Herein, the concurrent fixing adopts means that the printed circuit board 1A is processed via a tin stove, so that the conducting ends of the electronic element 2A and the LED 3A are able to be soldered to the printed circuit board 1A.

Figure 13:
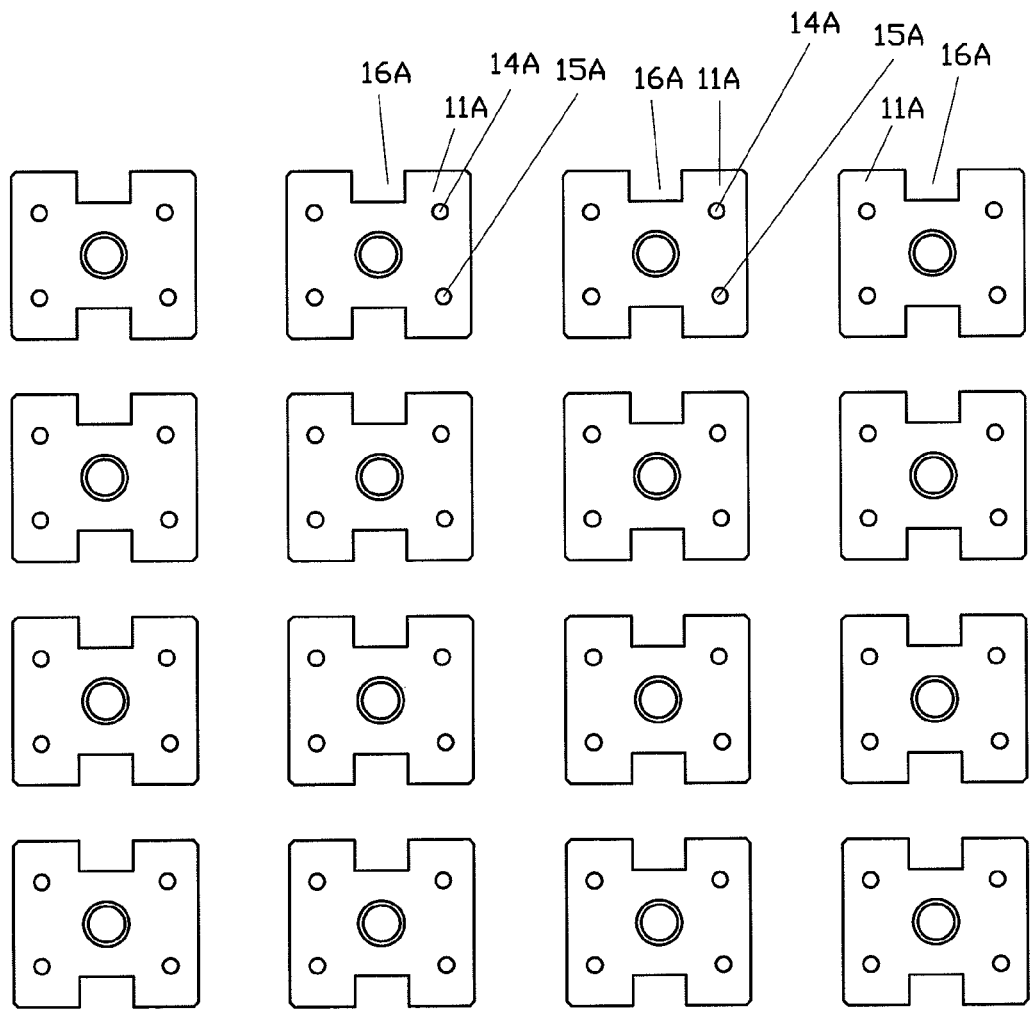
FIG. 13 is a schematic view showing each board being separated to form a LED module unit.

Referring to FIG. 13, separating each board 11A constructs a LED module unit.

Figure 14:
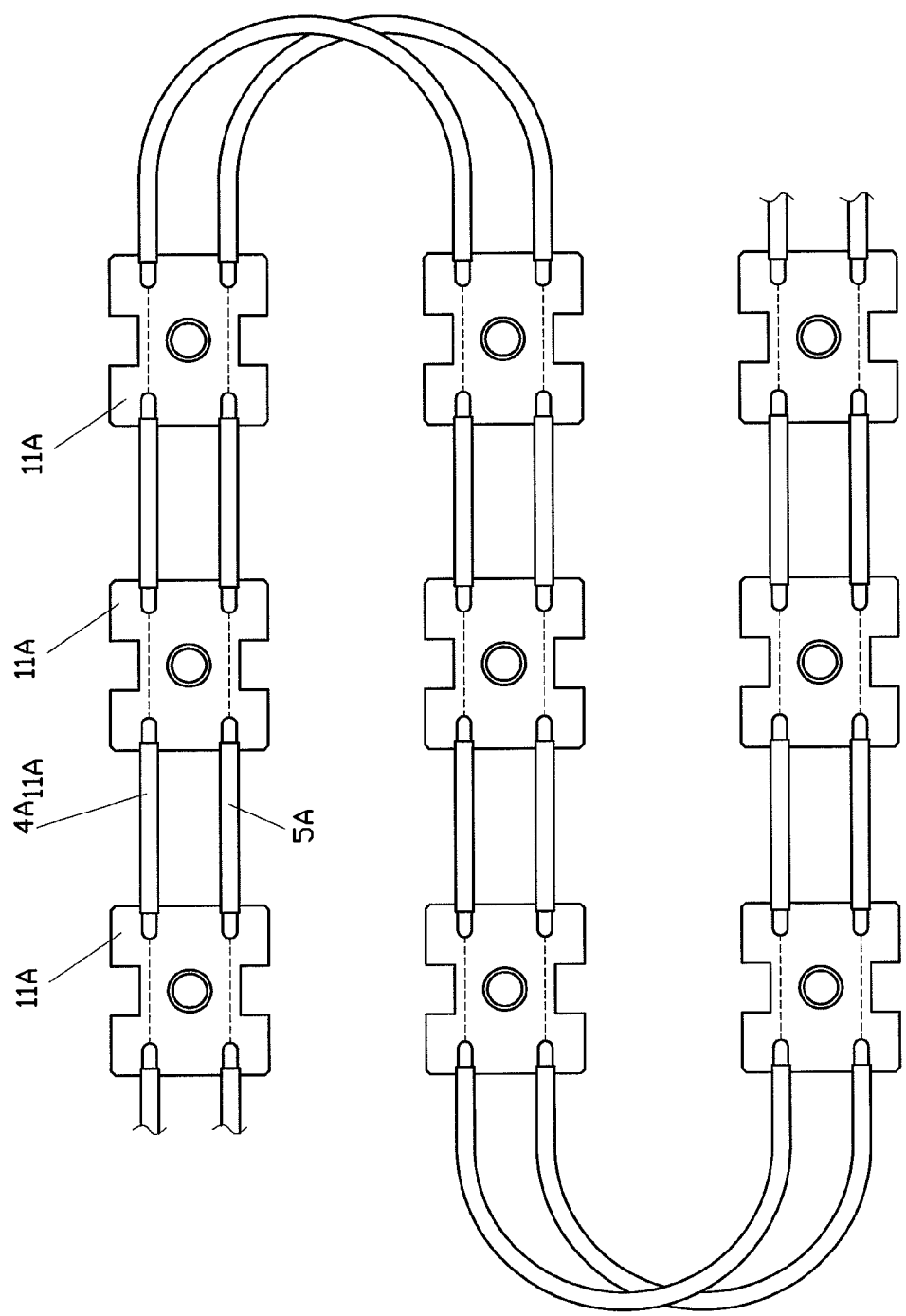
FIG. 14 is a schematic view showing a positive guiding line and a negative guiding line being soldered to the printed circuit board and showing the correlated relationship among each component.

Referring to FIG. 14, a number of positive guiding lines 4A are disclosed. Each positive guiding line 4A is soldered to either the front or the back of the positive joint 14A of the adjacent board. A number of negative lines 5A are disclosed. Each of the negative line 5A is soldered to either the front or the back of the negative joint 15A of the adjacent board. Thereby, a LED module is formed, and each board 11 is flexible as shown in FIG. 8. Preferably, a tool (not shown) could be favorably adopted for fixing the board 11 while soldering the board 11, thereby conveniently soldering the lamp string.

I claim:

1. A method for packing a light emitting diode (LED) module comprising steps of:

A. classifying a printed circuit board into a plurality of boards in accordance with a matrix permutation; either part of said boards or each board defining a positive line and a negative line; at least one positive joint of said positive line and at least one negative joint of said negative line being defined on a longitudinal end or a lateral end of said board;

B. connecting conducting ends of at least one electronic element and at least one LED to said positive line and said negative line, respectively;

C. connecting a positive guiding line to each positive joint, and connecting a negative guiding line to each negative joint;

D. fixing said conducting ends of said electronic element and said LED, said positive guiding line, and said negative guiding line to said printed circuit board, concurrently; and E. separating each board to form a LED module.

2. The method as claimed in claim 1, wherein, said concurrent fixing is achieved by processing said printed circuit board via a tin stove, thereby allowing said conducting ends of said electronic element and said LED, said positive guiding line, and said negative guiding line to be fixed to said printed circuit board so as to form a lamp string.

3. A method for packing a LED module comprising steps of:

A. classifying a printed circuit board into a plurality of boards via a matrix permutation; each board defining a positive line and a negative line; a positive joint of said positive line and a negative joint of said negative line being respectively disposed near a longitudinal end or a lateral end of said board;

B. connecting conducting ends of at least one electronic element and at least one LED to said positive line and said negative line, respectively;

C. fixing said conducting ends of said electronic element and said LED to said printed circuit board, concurrently;

D. separating each board to form a LED module unit; and

E. connecting a plurality of positive guiding lines to said positive joint of said adjacent board, and connecting a plurality of negative guiding lines to said negative joint of said adjacent board, thereby forming a LED module.

4. The method as claimed in claim 3, wherein, said concurrent fixing is achieved by processing said printed circuit board via a tin stove, thereby fixing said conducting ends of said electronic element and said LED to said printed circuit board.

* * * * *